US007242779B2

(12) United States Patent
Coats et al.

(10) Patent No.: US 7,242,779 B2
(45) Date of Patent: Jul. 10, 2007

(54) METHODS AND APPARATUS FOR SUB-HARMONIC GENERATION, STEREO EXPANSION AND DISTORTION

(75) Inventors: Elon Ray Coats, Meridian, MS (US); Earnest Lloyd Trammell, Meridian, MS (US)

(73) Assignee: Peavey Electronics Corporation, Meridian, MS (US)

( * ) Notice: Subject to any disclaimer, the term of this patent is extended or adjusted under 35 U.S.C. 154(b) by 513 days.

(21) Appl. No.: 10/158,628

(22) Filed: May 30, 2002

(65) Prior Publication Data

US 2003/0223588 A1 Dec. 4, 2003

(51) Int. Cl.
*H03G 3/00* (2006.01)

(52) U.S. Cl. .......................................... 381/61; 381/98

(58) Field of Classification Search ................. 381/17, 381/18, 1, 61, 98

See application file for complete search history.

(56) References Cited

U.S. PATENT DOCUMENTS

| | | | | |
|---|---|---|---|---|
| 4,182,930 | A * | 1/1980 | Blackmer | 381/28 |
| 4,841,572 | A | 6/1989 | Klayman | |
| 4,866,774 | A | 9/1989 | Klayman | |
| 5,369,224 | A | 11/1994 | Miyata | |
| 5,440,638 | A | 8/1995 | Lowe et al. | 381/17 |
| 5,473,108 | A | 12/1995 | Matsuda et al. | |
| 5,619,578 | A | 4/1997 | Sondermeyer et al. | |
| 5,647,004 | A | 7/1997 | Sondermeyer et al. | |
| 5,774,556 | A | 6/1998 | Lowe et al. | |
| 5,822,437 | A | 10/1998 | Winterer | |
| 6,023,513 | A | 2/2000 | Case | |
| 6,111,960 | A | 8/2000 | Aarts et al. | |
| 6,122,381 | A | 9/2000 | Winterer | 381/17 |
| 6,134,330 | A * | 10/2000 | De Poortere et al. | 381/61 |
| 6,307,941 | B1 | 10/2001 | Tanner et al. | |
| 6,335,973 | B1 | 1/2002 | Case | |
| 6,504,935 | B1 | 1/2003 | Jackson | |
| 6,845,165 | B1 | 1/2005 | Motohashi | |
| 2003/0002684 | A1 | 1/2003 | Coats et al. | |
| 2003/0044024 | A1 | 3/2003 | Aarts et al. | |

FOREIGN PATENT DOCUMENTS

EP 0994464 A1 4/2000

OTHER PUBLICATIONS

U.S. Appl. No. 09/727,903, filed Dec. 1, 2000, Coats et al.
U.S. Appl. No. 11/053,716, filed Feb. 8, 2005, Coats et al.
*120XP Subharmonic Synthesizer*, A Harman International Company, Nov. 5, 1997, pp. 1-2.

* cited by examiner

*Primary Examiner*—Xu Mei
(74) *Attorney, Agent, or Firm*—Matthew B. Dernier; Kaplan Gilman Gibson & Dernier LLP

(57) ABSTRACT

Methods and apparatus are disclosed that achieve sub-harmonic signal processing, stereo-width expansion, sub-woofer signal processing, and tube distortion emulation to achieve various desirable acoustic effects when used to modify an input signal containing, for example, music content.

27 Claims, 10 Drawing Sheets

METHODS AND APPARATUS FOR SUB-HARMONIC GENERATION, STEREO EXPANSION AND DISTORTION

BACKGROUND OF THE INVENTION

The present invention relates to producing a synthesized signal that is derived from an input signal and includes frequency content not contained in the input signal. The present invention also relates to increasing the stereo width produced by signals from left and right channels.

Conventional sub-harmonic generators are used to modify an input signal to produce a sub-harmonic signal having at least some desirable characteristics. In music reproduction/processing contexts, an input signal may include frequency components taken from an audible range of about 20 Hz to about 20,000 Hz. The conventional sub-harmonic generator produces an output signal that includes energy at substantially all of the frequency components of the input signal plus additional energy at frequency components in a sub-harmonic range. In some cases, the output signal includes energy at only a subset of the frequency components of the input signal (such as a sub-woofer range) plus the additional energy in the sub-harmonic range. Usually, a range of frequency components from the input signal are utilized to derive the frequency components in the sub-harmonic range, and the input signal is augmented with the frequency components in the sub-harmonic range to obtain the output signal.

In theory, these conventional sub-harmonic generators produce desirable characteristics in the output signal, such as increased signal energy in the sub-harmonic range, thereby producing a richer bass response when converted into audible sound energy. In practice, however, the audible characteristics of the output signal from conventional sub-harmonic generators suffer from a number of disadvantages, namely (i) a relatively flat (or "cardboard") audible sound is obtained from the output signal due primarily to the increase in energy from sub-harmonic frequency components without modifying other frequency characteristics of the input signal, this disadvantage may also manifest in a "rumbly" sound depending on the frequency content of the input signal; and (ii) the audible sound exhibits poor "attack" and "decay" characteristics due to an inability by the sub-harmonic generator to accurately reflect an amplitude envelope of the input signal as a function of the frequency components of interest. Thus, the energy of the output signal in the sub-harmonic frequency range does not exhibit desirable amplitude characteristics. In addition, conventional sub-harmonic generators have not effectively utilized sub-harmonic signals in stereo applications, particularly where maintaining stereo "width" is of importance.

Peavey Electronics Corporation, the assignee of the present invention, has developed a sub-harmonic generator, called KOSMOS™, that avoids flat, cardboard sounding characteristics in an output signal. The KOSMOS™ system achieves this by modifying frequency components at least partially outside the sub-harmonic range, and using the amplitude envelope of the input signal (as a function of frequency components in the relevant frequency range) in producing the output signal. The KOSMOS™ system also increases stereo width characteristics created by signals from left and right channels and improves sound clarity above certain frequencies. Further details concerning the KOSMOS™ system may be found in U.S. patent application Ser. No. 09/727,903 filed Dec. 1, 2000, entitled SUB-HARMONIC GENERATOR AND STEREO EXPANSION PROCESSOR, the entire disclosure of which is hereby incorporated by reference.

SUMMARY OF THE INVENTION

The present invention provides improvements over existing sub-harmonic generators and achieves further functionality in its sub-harmonic generator, such as providing adjustability (preferably user adjustability) of the sub-harmonic amplitude envelope. Indeed, it has been found that this can result in highly enjoyable sound characteristics. For example, a percussive attack effect can be achieved when the rate of attack or decay of the amplitude envelope of the sub-harmonic signal is increased, which effect can improve (or synthesize) the sound of a kick-drum or the like. It has also been found to be desirable to modify the energy level of the amplitude envelope of the sub-harmonic signal under certain circumstances, such as when the rates of sloping portions of the amplitude envelope of the sub-harmonic signal are increased. Indeed, in that case, increasing the energy level of the amplitude envelope would tend to balance an apparent decrease in the energy level of the amplitude envelope resulting from a faster slope. In an alternative situation, where the rates of the sloping portions of the amplitude envelope have been reduced, it has been found that a desirable balance in the energy level of the amplitude envelope results when such energy level is reduced.

The present invention still further provides for enhancing the sub-harmonic effect by enabling an adjustment (preferably a user adjustment) in the frequency characteristics of a sub-woofer audio signal, which signal is aggregated with the sub-harmonic signal.

The present invention also provides for adjustability in an amount of stereo width expansion produced by left and right channels of a stereo system. More particularly, in accordance with the present invention, it has been discovered that desirable sound characteristics are achieved when a balance between the amount of stereo width expansion and an amount of high frequency boost is made adjustable (preferably user adjustable) in each of the left and right channels. This advantageously permits a user to adjust this balance to achieve overtones, timbre, etc. that complement the character of the audio content.

The present invention further provides for introducing an acoustic brightness into the audio content, preferably into both the left and right channels of a stereo signal. More particularly, the present invention provides for aggregating an adjustable level (preferably user adjustable) of additional harmonic frequency content to the left and right channels, which frequency content emulates the higher frequency distortion effects of a vacuum tube amplifier. Advantageously, the present invention contemplates offsetting frequency characteristics of the added harmonic frequency content provided in the left and right channels of the audio content to increase and/or complement the stereo width expansion effect.

In accordance with at least one aspect of the present invention, a sub-harmonic generator includes: an input filter operable to receive an input signal containing frequencies from among a first range and to produce a first intermediate signal containing frequencies from among a second range; a signal divider circuit operable to receive the first intermediate signal and to produce a second intermediate signal containing signal components at frequencies from among a third range, the third range of frequencies being about one octave below the second range of frequencies; an envelope detector operable to produce an envelope signal corresponding to an instantaneous amplitude of the first intermediate signal; a gain control circuit operable to at least variably adjust a gain of the envelope signal; and a voltage controlled amplifier operable to amplify the second intermediate signal by an amount proportional to the envelope signal to produce a sub-harmonic signal.

In accordance with at least one other aspect of the present invention, a sub-harmonic generator includes: a sub-harmonic signal circuit operable to (i) receive an input signal containing frequencies from among a first range, (ii) filter the input signal to produce a first intermediate signal containing frequencies from among a second range, and (iii) produce a sub-harmonic signal from the first intermediate signal containing frequencies from among a third range, the third range of frequencies being about one octave below the second range of frequencies; at least one band-pass filter operable to receive the input signal and to produce a second intermediate signal containing frequencies from among a fourth range, the fourth range of frequencies including at least some frequencies above the third range of frequencies; a frequency adjustment circuit operable to change at least one filtering characteristic of the at least one band-pass filter; and a summation circuit operable to sum the sub-harmonic signal and the second intermediate signal to produce at least a portion of an output signal.

In accordance with at least one other aspect of the present invention, an expansion circuit for increasing an apparent stereo width produced by a left channel signal and a right channel signal, includes: a left channel circuit operable to (i) substantially cancel energy at at least some frequencies from among a first range of frequencies of the left channel signal; (ii) produce an inverted left channel signal containing a band of frequencies from among a second range of frequencies; and (iii) produce a left channel high pass signal from the left channel signal containing frequencies from among those at or above a first corner frequency; and a right channel circuit operable to (i) substantially cancel energy at at least some frequencies from among the second range of frequencies of the right channel signal; (ii) produce an inverted right channel signal containing a band of frequencies from among the first range of frequencies; (iii) produce a right channel high pass signal from the right channel signal containing frequencies from among those at or above a second corner frequency, wherein: the left channel circuit further includes a left channel summation circuit operable to adjustably sum at least the left channel high pass signal and the inverted right channel signal to produce a left channel expansion signal; and the right channel circuit further includes a right channel summation circuit operable to adjustably sum at least the right channel high pass signal and the inverted left channel signal to produce a right channel expansion signal.

In accordance with at least one other aspect of the present invention, a signal processing system for modifying characteristics of left and right channel signals includes: a left channel circuit operable to (i) produce a left channel high pass signal from the left channel signal containing frequencies from among those at or above a first corner frequency; and (ii) distort the left channel high pass signal to produce a left channel distortion signal having at least second harmonic frequency components of the left channel high pass signal; and a right channel circuit operable to (i) produce a right channel high pass signal from the right channel signal containing frequencies from among those at or above a second corner frequency; and (ii) distort the right channel high pass signal to produce a right channel distortion signal having at least second harmonic frequency components of the right channel high pass signal, wherein: the left channel circuit further includes a left channel summation circuit operable to sum at least the left channel signal and the left channel distortion signal to produce at least a portion of a left channel output signal; and the right channel circuit further includes a right channel summation circuit operable to sum at least the right channel signal and the right channel distortion signal to produce at least a portion of a right channel output signal.

The signal processing system may also be combined with at least one of the stereo width expansion circuit and the sub-harmonic generator circuit discussed above.

In accordance with at least one further aspect of the present invention, or more methods for obtaining the various functions of the apparatus discussed above and later in this description are contemplated. Examples of basic block diagrams illustrating such methods are discussed later in this description. These methods may be carried out using suitable hardware, such as analog circuitry, digital circuitry, and/or a combination thereof. Examples of suitable analog circuitry for carrying out the actions of the methods, and/or for implementing the functions of the apparatus, represented by the block diagrams are also discussed later in this description. Given the disclosure herein regarding the actions/functions represented by the block diagrams (and the disclosure herein regarding the analog circuitry), digital circuit implementations and/or combinations of analog and digital circuit implementations will be readily apparent to one skilled in the art and clearly recognized as falling within the scope of the invention as claimed. For example, some or all of the actions/functions of the invention may be implemented using one or more programmable digital devices or systems, such as one or more programmable read only memories (PROMs), one or more programmable array logic devices (PALs), one or more microprocessor based systems operating under the control of one or more software programs, etc. Further, the essence of the present invention may be embodied in a computer program that is stored in a digital storage medium, such as a disk, electronic medium, etc., which program may then be distributed using known (or hereafter developed) channels.

Other aspects, features and advantages of the invention will become apparent to one skilled in the art in view of the disclosure herein taken in combination with the accompanying drawings.

BRIEF DESCRIPTION OF THE DRAWINGS

For the purpose of illustrating the invention, there are shown in the drawings forms that are presently preferred, it being understood, however, that the invention is not limited to the precise arrangements and instrumentalities shown.

DETAILED DESCRIPTION

Figure 1:
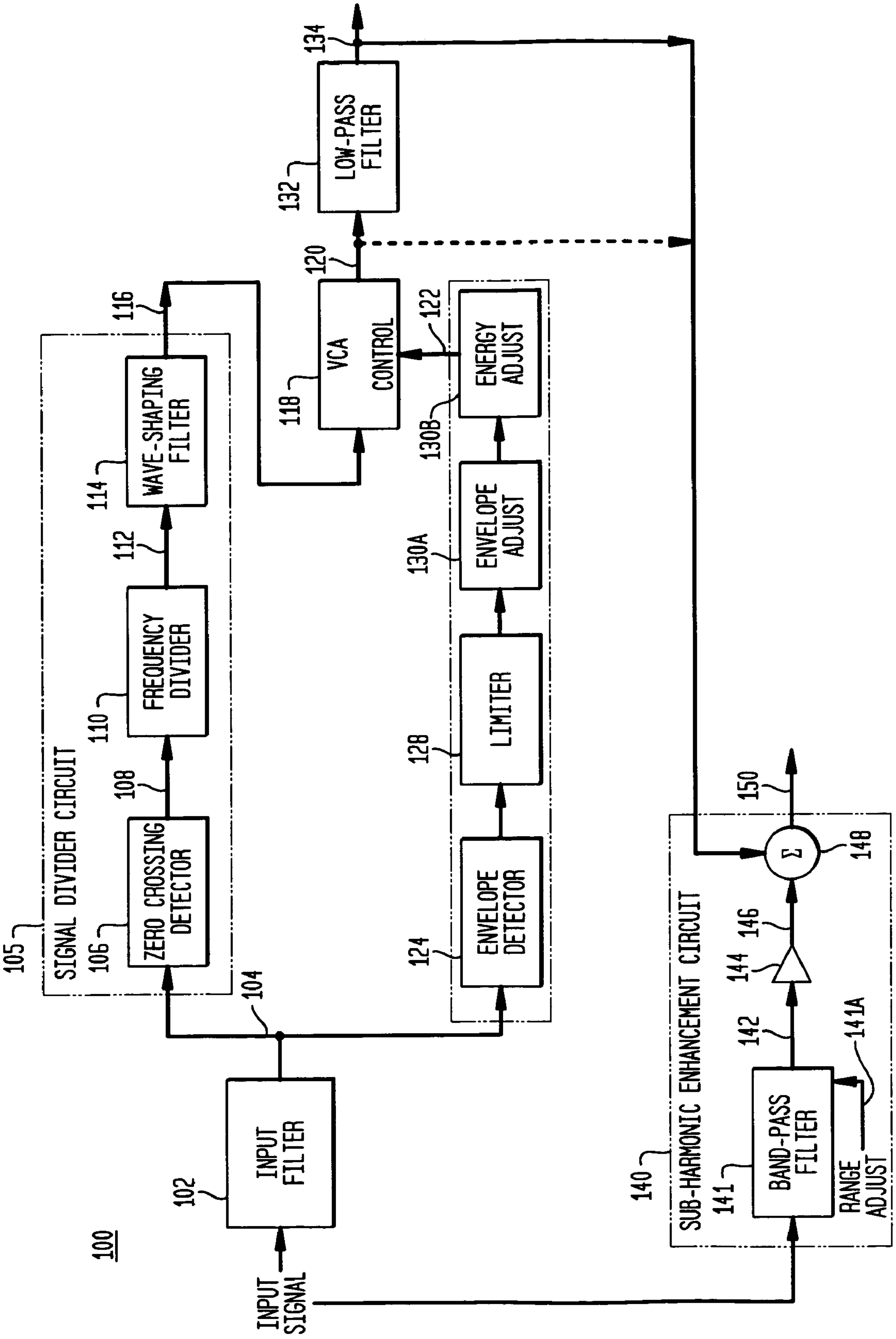
FIG. 1 is a block diagram of a sub-harmonic generator in accordance with one or more aspects of the present invention.

Turning now to the drawings wherein like numerals indicate like elements, there is shown in FIG. 1 a block diagram of a sub-harmonic generator 100 in accordance with one or more aspects of the present invention. It is noted that for the sake of clarity and brevity the block diagram of FIG. 1 will be discussed as being directed to an apparatus 100. It is understood, however, that the block diagram has equal applicability as to the description of one or more methods where the actions thereof correspond to the functionality of the illustrated blocks. The sub-harmonic generator 100 includes an input filter 102, a signal divider 105, a voltage controlled amplifier 118, and a gain control 123. Further embodiments of the sub-harmonic generator 100 may also include a low pass filter 132, a sub-harmonic enhancement 140, which preferably includes at least one adjustable band-pass filter 141, an amplifier 144 and a summing function 148.

Figure 2A:
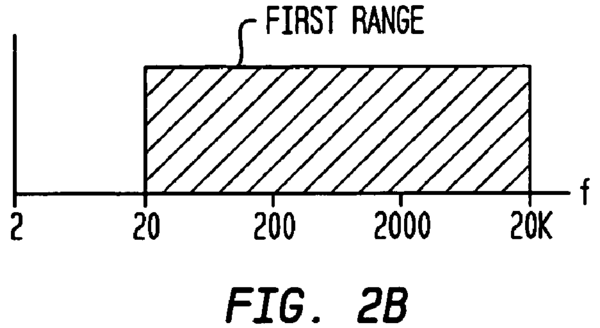
FIG. 2A is a graph (having a logarithmic ordinate scale) illustrating a possible first range of frequencies, where an input signal to the sub-harmonic generator of FIG. 1 may contain frequencies from among the first range of frequencies.

The input filter 102 is preferably operable to receive an input signal containing frequencies from among a first range and to produce a first intermediate signal on node 104 containing frequencies from among a second range. The input filter 102 is preferably implemented by a band-pass filter and may be referred to herein as "band-pass filter 102." Referring to FIG. 2A, the input signal may contain audible frequency components, for example, from among frequencies between about 20 Hz and about 20,000 Hz. It is understood that FIG. 2A is given by way of illustration only and is not intended to limit the scope of the present invention (e.g., the input signal may contain frequencies outside the audible frequency range and still be considered within the scope of the invention).

Figure 2B:
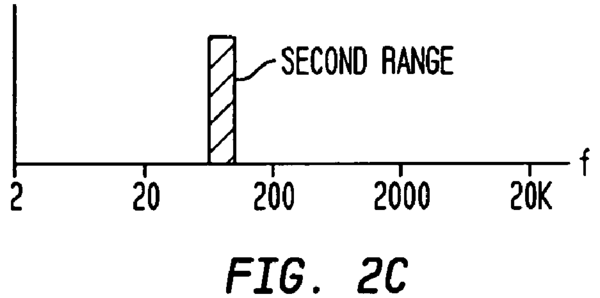
FIG. 2B is a graph (having a logarithmic ordinate scale) illustrating a possible second range of frequencies that may be included in an intermediate signal produced by the sub-harmonic generator of FIG. 1.

With reference to FIG. 2B, the second range of frequencies preferably falls within the first range of frequencies, and in the case of an audible input signal (such as music) the second range most preferably falls at a low end of the first range. Although the invention is not limited by any theory of operation, it has been found through experimentation that a second range of frequencies extending from about 40 Hz to about 110 Hz is desirable when the input signal contains audible frequencies, such as music. It has also been found through experimentation that a second range extending from about 56 Hz to about 96 Hz works particularly well when the sub-harmonic generator 100 is employed to modify an audible input signal for increasing listening pleasure.

Figure 3:
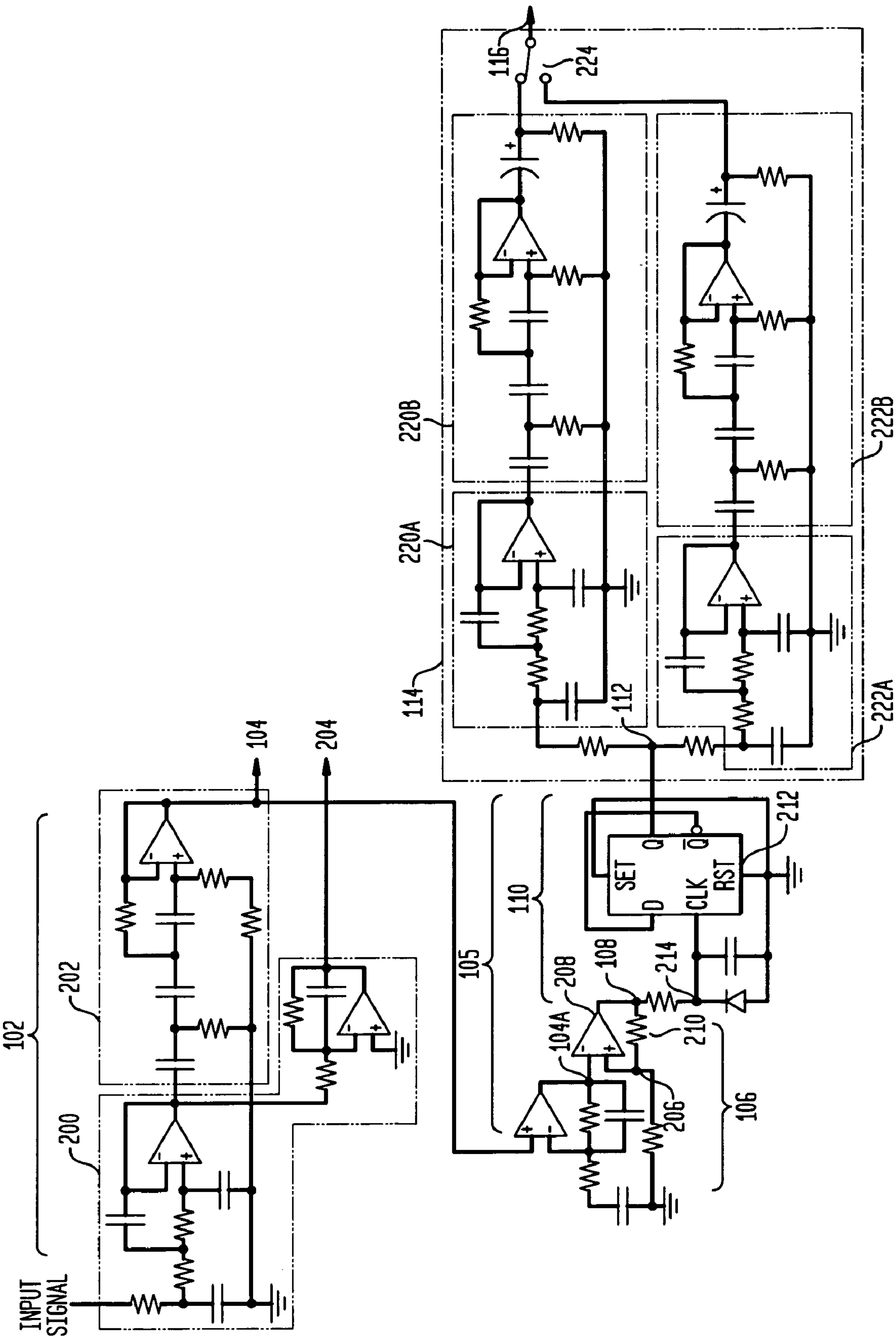
FIG. 3 is a detailed schematic illustrating examples of circuits suitable for implementing one or more actions/functions of the sub-harmonic generator of FIG. 1.

The band-pass filter 102 may be implemented using any of the known (or hereinafter developed) circuit techniques. With reference to FIG. 3, the band-pass filter 102 is preferably implemented utilizing a cascaded low pass filter 200 and high pass filter 202 to produce the intermediate signal on node 104. The low pass filter 200 may be implemented by way of active circuitry (as shown), or by way of passive circuitry, and may include single or multiple poles as may be desired. It is noted that although an analog circuit implementation is shown in FIG. 3, digital techniques may alternatively or additionally be employed to implement the input filter 102 and/or to carry out its actions/functions. It is most preferred that the low pass filter 200 includes a first corner frequency substantially at an upper end of the second range of frequencies (FIG. 2B), such as at 96 Hz. Preferably, a low pass signal is obtained on node 204 that contains frequencies substantially at or below the first corner frequency, such as 96 Hz. (As will be discussed in more detail hereinbelow, the low pass signal on node 204 may be utilized to produce a sub-woofer signal.) The high pass filter 202 may also be implemented using active circuitry (as shown), or passive circuitry, and may include a single or multiple poles as may be desired. It is preferred that the high pass filter 202 includes a second corner frequency, below the first corner frequency of the low pass filter 200, substantially at a lower end of the second range of frequencies (FIG. 2B), such as at 56 Hz.

Those skilled in the art will appreciate that the low pass filter 200 and high pass filter 202 would not exhibit "brick wall" transfer characteristics as is illustrated by the second range shown in FIG. 2B; indeed, a practical band-pass filter exhibits a gradual transition in gain characteristics through the pass band and other frequencies of interest. Thus, the brick wall representations shown in FIGS. 2A-2B (and FIGS. 2C-2E for that matter) are utilized for the sake of clarity, e.g., to illustrate the frequency interrelationships between respective ranges. In a practical circuit, however, the first range, second range, etc. will probably exhibit gradual transitions in gain through frequencies of interest. Consequently, a determination as to whether a frequency is "within" or "outside" a particular range illustrated is intended to be made with the understanding that gradual attenuation may be obtained at frequencies near corner frequencies of the band-pass filter 102 (and the other filters discussed hereinbelow).

Figure 2C:
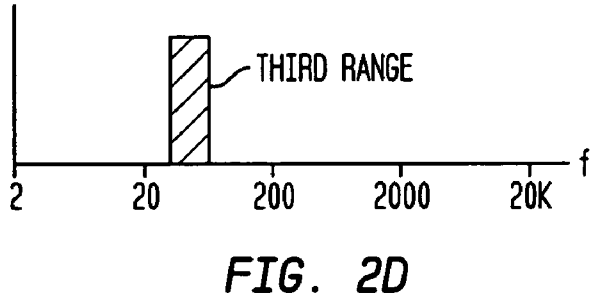
FIG. 2C is a graph (having a logarithmic ordinate scale) illustrating a possible third range of frequencies that may be included in another intermediate signal produced by the sub-harmonic generator-harmonic generator of FIG. 1.

Referring again to FIG. 1, the signal divider 105 is preferably operable to receive the intermediate signal on node 104 and to produce an intermediate signal on node 116 that contains substantially sinusoidal frequency components at frequencies about one octave below the second range of frequencies. Preferably, the signal divider 105 achieves this function by employing a zero crossing detector 106, a frequency divider 110, and a wave-shaping filter 114. The combination of the zero crossing detector 106 and the frequency divider 110 preferably receives the intermediate signal on node 104 and produces square wave signal on node 112, where the square wave signal contains fundamental square wave signal components at frequencies about one octave below the second range of frequencies. With reference to FIG. 2C, the square wave signal components preferably include frequencies from among a third range of frequencies that are about one octave below the second range of frequencies. Thus, when the second range of frequencies extends from about 40 Hz to about 110 Hz, the third range of frequencies preferably extends from about 20 Hz to about 55 Hz. It has been found through experimentation that particularly advantageous and pleasing listening results are obtained when the third range of frequencies extends from about 28 Hz to about 48 Hz. It is noted that the square wave signal on node 112 will include signal energy at fundamental frequencies substantially within the third range of frequencies and harmonic frequencies substantially outside the third range of frequencies. For simplicity, however, the third range of frequencies illustrated in FIG. 2C shows only the fundamental frequency components and omits the harmonic frequency components of the square wave signal.

The zero crossing detector 106 is preferably operable to produce a zero crossing signal on node 108 that transitions each time the intermediate signal on node 104 substantially matches a reference potential. Any of the known (or hereafter developed) circuit implementations for carrying out the functions of the zero crossing detector 106 may be used and are considered within the scope of the invention. For example, with reference to FIG. 3, a detailed analog circuitry schematic of a zero crossing detector 106 is illustrated. It is noted that although an analog circuit implementation is shown, digital techniques may alternatively or additionally be employed to implement the zero crossing detector 106 and/or to carry out its actions/functions. The zero crossing detector 106 of FIG. 3 preferably includes a comparator 208 operable to compare respective amplitudes of a reference potential on node 206 and the intermediate signal on node 104. It is noted that the intermediate signal on node 104 preferably passes through an amplifier/buffer stage to produce a similar intermediate signal on node 104A, although this stage is not required to carry out the invention. The zero crossing signal on node 108 transitions from high-to-low or low-to-high each time the amplitude of the reference potential on node 206 substantially equals the intermediate signal on node 104A. The "high" and "low" levels are a function of the specific circuit implementation. Here, the high level is about 5 V and the low level is about 0 V (or ground potential).

The zero crossing detector 106 preferably includes a hysteresis circuit operable to adjust the amplitude of the reference potential on node 206 each time the zero crossing signal on node 108 transitions from high-to-low or low-to-high. By way of example, a resistor 210 is coupled from node 108 to an input terminal (here, the noninverting input terminal) of the comparator circuit 208, which is also node 206. Thus, each time the zero crossing signal on node 108 transitions, more or less voltage is induced on node 206, thereby adjusting the reference potential. The hysteresis prevents undesirable oscillations in the zero crossing signal on node 108 and also tends to eliminate beat frequency signal components that may be present in the intermediate signal on node 104A.

Referring now to FIGS. 1 and 3, the frequency divider 110 is preferably operable to receive the zero crossing signal on node 108 and to produce the square wave signal on node 112 such that the square wave signal transitions once each time the zero crossing signal transitions twice. Any of the known (or hereafter developed) circuit implementations for carrying out the function of the frequency divider 110 may be employed. An analog and digital circuit implementation is illustrated in FIG. 3, although purely analog or purely digital techniques may alternatively be employed to implement the frequency divider 110 and/or to carry out its functions. Preferably, the frequency divider 110 is implemented using a flip-flop circuit 212, such as an edge sensitive flip-flop or a level sensitive flip-flop. The zero crossing signal on node 108 is coupled to a clock terminal (node 214) of the flip-flop circuit 212. An amplitude limiting circuit employing a resistor, zener diode, and capacitor are employed to ensure that the amplitude of the zero crossing signal on node 214 does not damage the flip-flop circuit 212. It is noted that the square wave signal on node 112 will transition once each time the zero crossing signal on node 214 transitions twice. This advantageously results in a square wave signal on node 112 that contains fundamental frequencies within the third range of frequencies (FIG. 2C). While the square wave signal on node 112 contains fundamental square wave frequencies in the third range (i.e., the sub-harmonic frequency range), it also contains undesirable harmonic frequencies outside the third range due to the harsh transitions of the square wave created by the flip-flop circuit 212. The square wave signal transitions between high and low values (e.g., 5 V and 0 V), and, therefore does not contain any information concerning the amplitude envelope of the input signal at frequencies of interest, e.g., in the second range.

Turning again to FIG. 1, the wave shaping filter 114 is preferably operable to receive the square wave signal on node 112, to attenuate frequencies substantially outside the third range of frequencies, and to produce an intermediate signal on node 116 that contains sinusoidal frequency components at frequencies corresponding substantially to the fundamental frequency components of the square wave signal on node 112. Thus, the intermediate signal on node 116 contains energy at frequencies from among the third range (e.g., the sub-harmonic range) without substantial energy at frequencies outside the third range. Any of the known (or hereafter developed) circuit implementations capable of carrying out the actions/functions of the wave shaping filter 114 may be employed. An example of an analog circuit implementation is shown in FIG. 3, although digital techniques may alternatively or additionally be employed to implement the wave shaping filter 114 and/or to carry out its functions.

With reference to FIG. 3, it is preferred that the wave shaping filter 114 includes at least one filter receiving the square wave signal on node 112 and substantially excluding frequencies thereof outside the third range. Most preferably, the wave shaping filter 114 includes a first band-pass filter 220 formed from a low pass filter 220A and a high pass filter 220B coupled in series. Preferably the corner frequencies of the low and high pass filters 220A and 220B are such that substantial exclusion of frequencies outside the third range of frequencies is obtained in the intermediate signal on node 116.

Preferably, the wave shaping filter 114 is operable such that the attenuated frequencies substantially outside the third range of frequencies are adjustable. By way of example, this adjustment may be obtained by employing at least one further filter receiving the square wave signal on node 112, and employing a single-pole-double-throw switch 224 that selects which of the filters produce the intermediate signal on node 116. For example, the further filter may be implemented using a further low pass filter 222A and a further high pass filter 222B that are coupled in series. Preferably, at least one of the corner frequencies of the low and high pass filters 222A, 222B are different than those of the low and high pass filters 220A, 220B, although exclusion of frequencies substantially outside the third range of frequencies is still obtained. In other words, a different range of frequencies is obtained. Advantageously, a listener may adjust the energy content of the intermediate signal on node 116 by way of switch 224 to suit his or her listening tastes or to ensure compatibility with other equipment, such as speaker equipment, etc.

With reference to FIG. 1, the voltage controlled amplifier 118 is preferably operable to amplify the intermediate signal on node 116 by an amount proportional to an amplitude envelope of the intermediate signal on node 104. A gain control 123 preferably produces an envelope signal on node 122 that corresponds to an instantaneous amplitude of the intermediate signal on node 104. The output of the voltage controlled amplifier 118 (node 120) is a sub-harmonic signal containing energy at frequencies which were not in the original input signal, but which corresponds to energy at frequencies of the input signal within the second range of frequencies. Advantageously, the envelope detector 124 ensures that the amplitude envelope of the sub-harmonic signal on node 120 substantially corresponds to the amplitude envelope of the intermediate signal on node 104 even though the frequency content of the sub-harmonic signal on node 120 falls within a range approximately one octave below the frequency content of the intermediate signal on node 104. It has been found that the correspondence of the amplitude envelope of the sub-harmonic signal on node 120 with the amplitude envelope of the intermediate signal on node 104 results in very pleasing audible characteristics when the input signal contains audio data, such as music.

Figure 4:
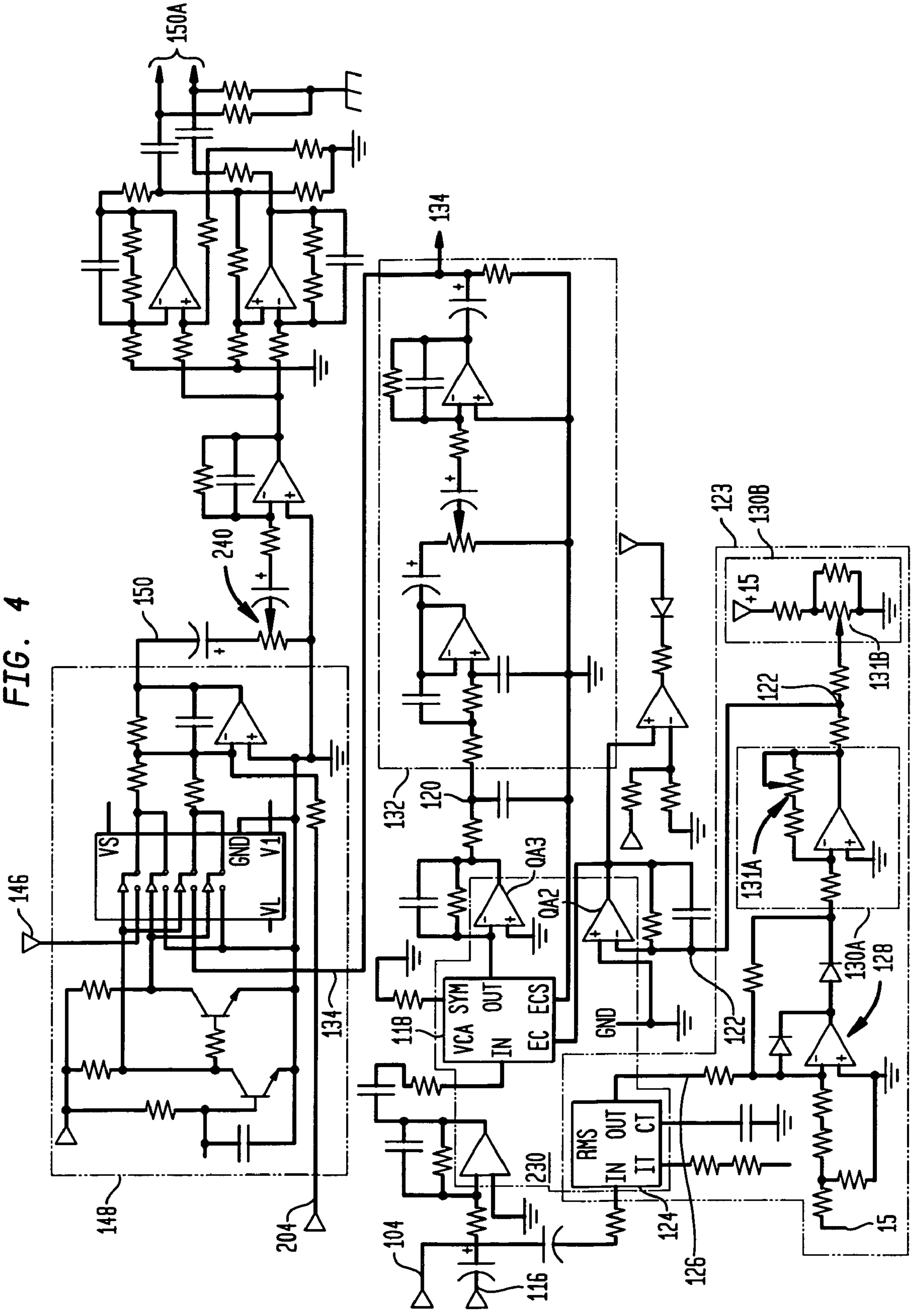
FIG. 4 is a detailed schematic illustrating examples of circuits that may be utilized to implement one or more further actions/functions of the sub-harmonic generator of FIG. 1.

Any of the known circuit implementations that are capable of carrying out the actions/functions of the voltage controlled amplifier 118 may be employed. With reference to FIG. 4, the functions of the voltage controlled amplifier 118 are preferably carried out utilizing an integrated circuit 230, such as the 4301H, purchasable from THAT Corporation.

The gain control 123 preferably includes an envelope detector 124, a threshold/limiter 128, an envelope adjustor 130A, and an energy adjustor 130B. Preferably, the envelope detector 124 is operable to receive the intermediate signal on node 104 and produce a signal on node 126 that is substantially equal to the instantaneous amplitude of the intermediate signal on node 104. By way of example, the envelope detector may include RMS detection techniques (e.g., an RMS detector) that produces (on node 126) the instantaneous RMS amplitude of the intermediate signal of node 104. Such RMS detection techniques are known in the art. Any of the known implementations of an RMS detector may be employed in accordance with the invention. For example, with reference to FIG. 4, an RMS detector 124 available within the integrated circuit 230 (the 4301H) may be used to carry out the actions/functions of the envelope detector 124.

The threshold/limiter 128 is preferably operable to limit the output from the envelope detector 124 such that the voltage controlled amplifier 118 is not overdriven, which could damage speakers or other sensitive circuitry. Those skilled in the art will appreciate that the threshold/limiter 128 could be placed anywhere prior to the voltage controlled amplifier 118 and need not be placed directly following the envelope detector 124. By way of example, the threshold/limiter may be implemented using analog circuitry as shown in FIG. 4, although it is understood that digital techniques may be alternatively or additionally employed in such implementation without departing from the scope of the invention. In this example, a feedback diode and series diode coupled to an operational amplifier provide a fixed amplification of the RMS signal on node 126 when that signal is below a threshold voltage. Under these signal conditions, the feedback diode is reverse biased and the series diode is forward biased. When the series resistor and feedback resistor of the operational amplifier are substantially the same, the fixed amplification is unity. When the RMS signal on node 126 rises above the threshold, the feedback diode forward biases, and the voltage output by the threshold/limiter 128 (at the cathode of the series diode) is maximized, in this case at zero volts. This limits the amplitude of the envelope signal on node 122, although, as discussed below, the energy adjustor 130B may increase the maximum amplitude of the envelope signal somewhat.

The envelope adjustor 130A is preferably operable to at least variably adjust the gain of the envelope signal on node 122. More particularly, the envelope adjustor 130A preferably variably increases or decreases rates at which sloping portions of the envelope signal rise or fall. For example, with reference to FIG. 5, under normal gain (e.g. unity) the sloping portions of the envelope signal may rise and fall at a particular rate. Under increased gain from the envelope adjustor 130A, however, the sloping portions of the envelope signal will rise and fall at higher rates. This can advantageously effect the acoustic characteristics of the sub-harmonic signal on node 120, such as increasing the percussive effect of a kick drum or the like. Conversely, under decreased gain from the envelope adjustor 130A, the sloping portions of the envelope signal will rise and fall at lower rates.

The envelope adjustor 130A may be implemented using any of the known techniques, such as using an analog circuit as shown in FIG. 4, although digital techniques may be alternatively or additionally employed in such implementation without departing from the scope of the invention. In particular, the envelope adjustor 130A may include an adjustable gain operational amplifier having a variable feedback impedance 131A, such as a potentiometer. It has been found that desirable acoustic characteristics are achieved when the adjustability of the gain is between about 1.7 to about 0.7, where a range of about 1.68 to about 0.68 is preferred. Preferably, the gain of the envelope adjustor 130A may be changed by way of user control, such as providing the user access to the potentiometer 131A.

Figure 5:
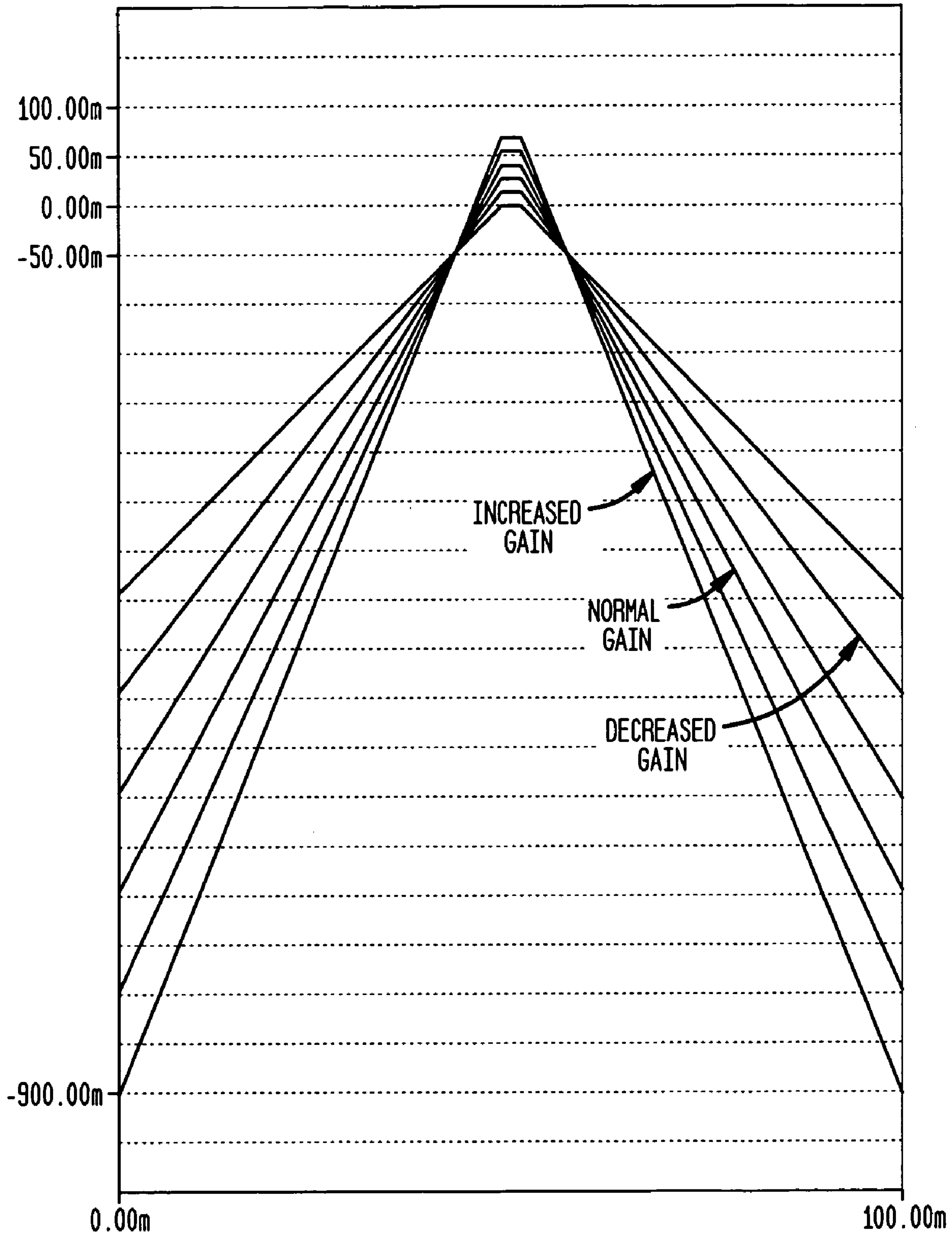
FIG. 5 is a graph illustrating certain properties of an amplitude envelope signal in accordance with one or more aspects of the present invention.

The energy adjustor 130B is preferably operable to increase or decrease the overall amplitude of the envelope signal on node 122 under certain circumstances. For example, when the envelope adjustor 130A operates to increase the rates of the slopes of the envelope signal, the energy adjustor 130B preferably increases the overall amplitude of the envelope signal. Indeed, as best seen in FIG. 5, when the rates of the sloping portions of the envelope signal are increased, the energy of the envelope signal drops (i.e., mathematically, the area under the voltage curve of the envelope signal reduces). This may occur even though the peak amplitude of the envelope signal is also raised by the increase in gain. The lower energy level tends to result in a measurable and potentially undesirable drop in the audible volume of the sub-harmonic signal on node 120. The energy adjustor 130B advantageously balances this reduction of energy by adding an offset voltage that increases the overall amplitude of the envelope signal. This intentionally increases the area under the voltage curve and compensates for any loss of volume of the sub-harmonic signal. Conversely, the energy adjustor 130B preferably decreases the overall amplitude of the envelope signal on node 122 when the envelope adjustor 130A decreases the rates at which the sloping portions of the envelope signal rise and fall. This advantageously compensates for any increases in the energy level of the envelope signal by subtracting an offset voltage from (or reducing the offset voltage added to) the envelope signal on node 122.

Preferably, the offset compensation provided by the energy adjustor 130B occurs simultaneously with any adjustment to the gain of the envelope signal provided by the envelope adjustor 130A. By way of example, the energy adjustor 130B may be implemented using analog techniques as illustrated in FIG. 4. There, a variable offset voltage is added to the envelope signal on node 122 by way of a resistor network including a variable resistor 131B (such as a potentiometer). Preferably, the variable resistor 131A of the envelope adjustor 130A is ganged with the variable resistor 131B of the energy adjustor 130B to achieve simultaneous adjustment of the envelope signal thereby.

With reference to FIG. 1, the low pass filter 132 is preferably employed to receive the sub-harmonic signal on node 120 and to produce a filtered sub-harmonic signal on node 134, where undesirable high frequency components of the sub-harmonic signal on node 120 are attenuated. These unwanted high frequencies are sometimes produced by non-ideal circuit characteristics of the voltage controlled amplifier 118, etc.

In accordance with at least one further aspect of the present invention, the sub-harmonic generator 100 of the present invention preferably includes a sub-harmonic enhancement 140 (FIG. 1), which is operable to boost energy of the input signal at frequencies from among a fourth range of frequencies (FIG. 2D) and aggregate the sub-harmonic signal taken at node 120 or node 134 with the boosted energy at those frequencies. The sub-harmonic enhancement 140 preferably includes a band-pass filter 141, an amplifier 144, and a summation circuit 148.

Figure 2D:
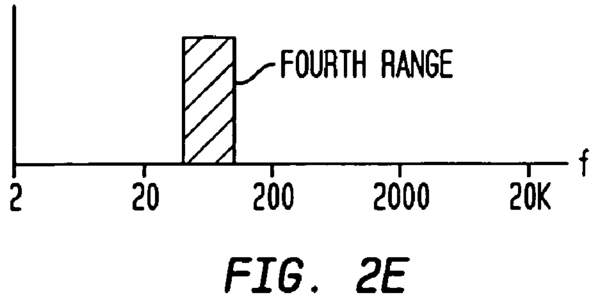
FIG. 2D is a graph (having a logarithmic ordinate scale) illustrating a possible fourth range of frequencies that may be included in still another intermediate signal produced by the sub-harmonic generator of FIG. 1.

The band-pass filter 141 is preferably operable to receive the input signal and to produce an intermediate signal on node 142 containing frequencies from among the fourth range of frequencies. With reference to FIG. 2D, it has been found through experimentation that desirable audible characteristics are obtained in the enhanced sub-harmonic signal on node 150 when the fourth range of frequencies extends from about 40 Hz to about 100 Hz. It is most preferred that the band-pass filter 141 includes one or more band-pass filters each having a respective center frequency such that aggregated outputs from the band-pass filters result in the intermediate signal on node 142. Preferably, the frequency response characteristics of the band-pass filter may be modified to obtain certain acoustic properties in the output. For example, the slope of the roll-off at the upper end of the fourth range of frequencies (FIG. 20) is preferably adjustable (e.g., increasing the roll-off by 3 db per decade or octave, etc.). This is preferably achieved by way of an adjustment input 141A produced by a frequency adjustor (not shown).

Figure 6:
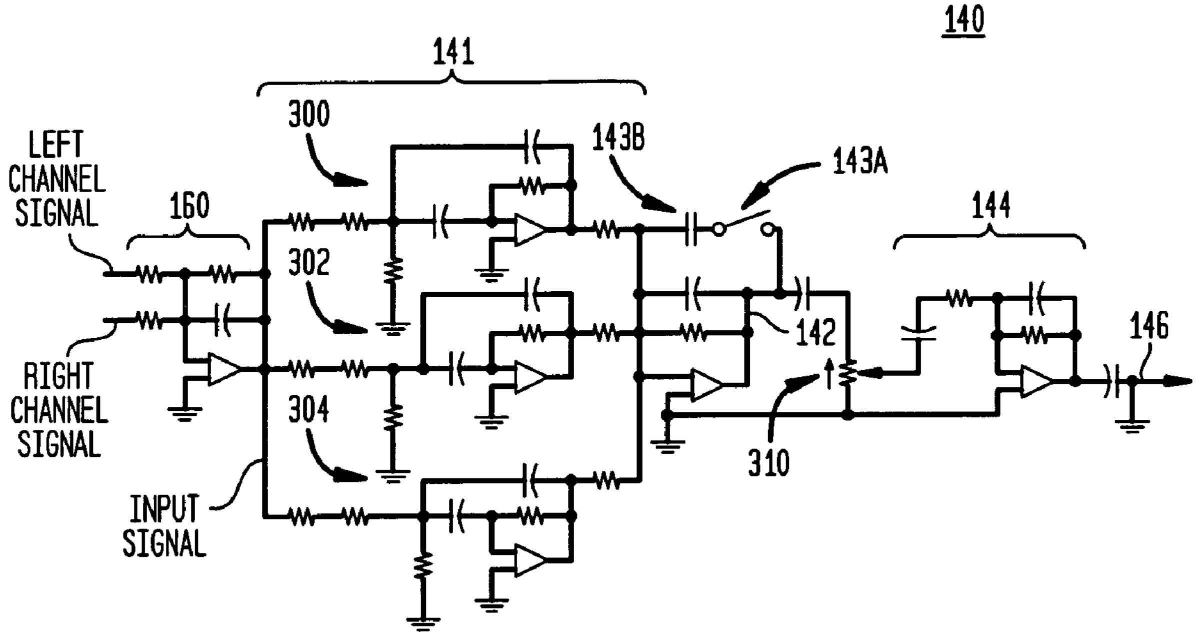
FIG. 6 is a detailed schematic diagram illustrating an example of one or more circuits suitable for implementing one or more further actions/functions of the sub-harmonic generator of FIG. 1.

With reference to FIG. 6, one example of an analog circuit implementation for the sub-harmonic enhancement 140, and the band-pass filter 141 in particular, is illustrated. Again, as with the other circuit examples herein, although an analog circuit implementation is illustrated and described, digital implementations including programmable implementations are also contemplated. It is most preferred that the band-pass filter 141 include first, second and third band-pass filters 300, 302, 304 having respective center frequencies such that a sum of outputs of the band-pass filters 300, 302, 304 exclude frequencies substantially outside the fourth range. It has been found that desirable characteristics are obtained in the intermediate signal on node 142 when (i) the first band-pass filter 300 has a center frequency within about 35 Hz to about 45 Hz, (ii) the second band-pass filter 302 has a center frequency within about 55 Hz to about 65 Hz, (iii) and the third band-pass filter 304 has a center frequency within about 95 Hz to about 105 Hz. It is most preferred that the first band-pass filter 200 has a center frequency of about 40 Hz, the second band-pass filter 302 has a center frequency of about 58 Hz, and the third band-pass filter 304 has a center frequency of about 98 Hz.

It has been found that Q-factors for the band-pass filters 300, 302, 304 may also affect the desirable qualities of the intermediate signal on node 142. Experimentation has revealed that advantageous results are obtained when the first band-pass filter 300 has a Q-factor from about 1.5 to about 2.0, the second band-pass filter 302 has a Q-factor from about 1.75 to about 2.25, and the third band-pass filter 304 has a Q-factor from about 1.75 to about 2.25. It is most preferred that the Q-factor of the first band-pass filter 300 is about 1.86, the Q-factor of the second band-pass filter 302 is about 2.0, and the Q-factor of the third band-pass filter 304 is about 2.0.

The frequency adjustor, which was discussed above as providing adjustable modification of certain frequency characteristics of the band-pass filter 141, may be implemented by way of a switch 134A (preferably user controllable) and a filtering impedance 143B, such as a capacitor. In this example, adding or removing the parallel capacitance in a feedback path as shown results in changing at least a position of a filter pole at an upper end of the fourth range of frequencies (FIG. 20). This can effect the downward slope of the upper end of the fourth range of frequencies in desirable ways, such as increasing or decreasing a perceived amount of bass from an output of the sub-harmonic enhancement 140. Those skilled in the art will appreciate from the description herein that other forms of frequency adjustment may be employed without departing from the scope of the invention, such as changing other frequency characteristics of the band-pass filter 141.

Referring to FIG. 1, the amplifier 144 is preferably operable to increase an amplitude of the intermediate signal on node 142 to produce an intermediate signal on node 146. It is most preferred that the sub-harmonic enhancement 140 includes an adjustment control operable to vary the magnitude of the intermediate signal on node 146. The adjustment control may be integral to the amplifier 144 or separate therefrom without departing from the scope of the invention. Any of the known circuit implementations for carrying out the functions of the amplifier 144 and/or adjustment control may be utilized. With reference to FIG. 6, the amplifier 144 is preferably implemented by way of operational amplifier(s) and other supporting circuit components. The adjustment control is preferably achieved by way of a potentiometer 310 operable to adjust the amplitude of the intermediate signal on node 142.

Referring now to FIGS. 1 and 4, the summation circuit 148 is preferably operable to sum the sub-harmonic signal (from node 120 or node 134) and the intermediate signal on node 146 to produce the enhanced sub-harmonic signal on node 150. Any of the known circuit implementations may be utilized to carry out the function of the summation circuit 148. With particular reference to FIG. 4, the summation circuit 148 is preferably implemented utilizing a conventional summing operational amplifier circuit. The filtered sub-harmonic signal on node 134 produced by the low pass filter 132 and the intermediate signal on node 146 are input to the summation circuit 148 to produce the enhanced sub-harmonic signal on node 150. Preferably, the summation circuit 148 is further operable to sum the (i) the sub-harmonic signal on node 134; (ii) the intermediate signal on node 146 and (iii) the low pass signal on node 204 to produce an enhanced sub-harmonic signal on node 150 suitable for use in a sub-woofer audio application. It is most preferred that a cut-out function is employed (integral or separate from the summation circuit 148) that is operable to disconnect the filtered sub-harmonic signal on node 134 and the intermediate signal on node 146 from the summation circuit 148 such that a pure sub-woofer signal is obtained on node 150. The cut-out function may be implemented, for example, by way of the solid states switch circuit shown. Advantageously, a user is thereby permitted to adjust characteristics of the signal on node 150 as desired. It is preferred that the enhanced sub-harmonic signal at node 150A is derived from the enhanced sub-harmonic signal at node 150. For example, the enhanced sub-harmonic signal on node 150 is preferably adjustable by way of potentiometer 240 such that a user can adjust an amplitude of the enhanced sub-harmonic signal on node 150A. Further equalization and/or filtering circuitry may be employed to obtain a more desirable version of the enhanced sub-harmonic signal on node 150A.

It is noted that the input signal may be obtained from any of the known sources, such as music recording media, other audio processors, etc. By way of example, the input signal is preferably derived from a stereo signal comprised of a left channel and a right channel. As shown in FIG. 6, the input signal is preferably obtained by way of a summation circuit 160 operable to add a left channel signal and right channel signal to produce the input signal.

Figure 7:
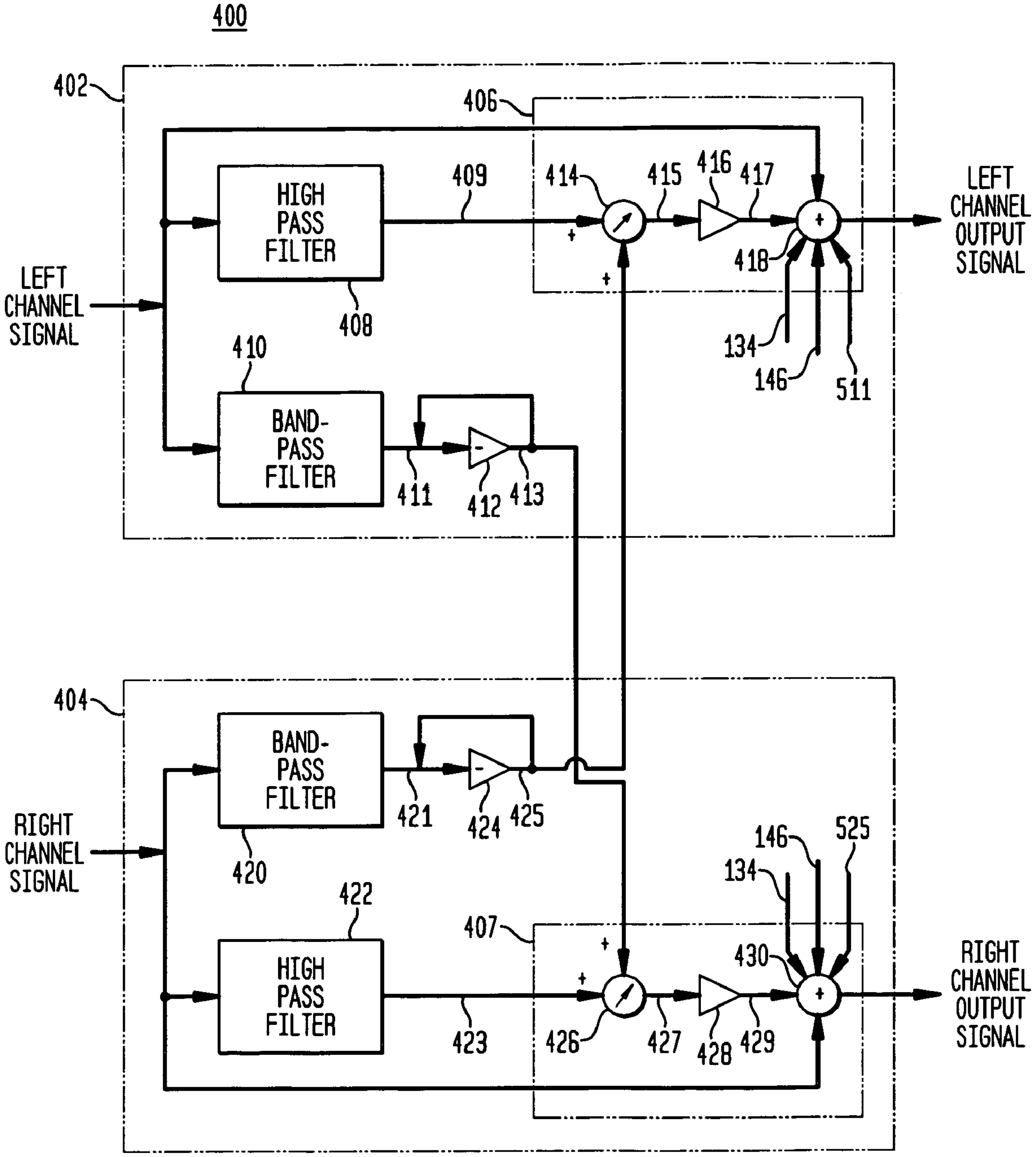
FIG. 7 is a block diagram of an expansion processor for increasing an apparent stereo width produced by left and right channel signals in accordance with one or more aspects of the present invention.

In accordance with at least one further aspect of the invention, the sub-harmonic generator 100 preferably works in conjunction with a stereo audio processor. With reference to FIG. 7, one such audio processor is preferably an expansion processor 400 for increasing an apparent stereo width produced by a left channel signal and a right channel signal. It is noted that the block diagram of the expansion processor 400 may represent an apparatus and/or a method, although for brevity the following description will assume that the block diagram represents an apparatus. The expansion processor 400 preferably includes a left channel circuit 402 and a right channel circuit 404 for adjusting respective characteristics of the left channel signal and the right channel signal. The left channel signal and right channel signal may, for example, be the same channel signals utilized to produce the input signal as discussed above with respect to the summation circuit 160 of FIG. 6.

Figure 2E:
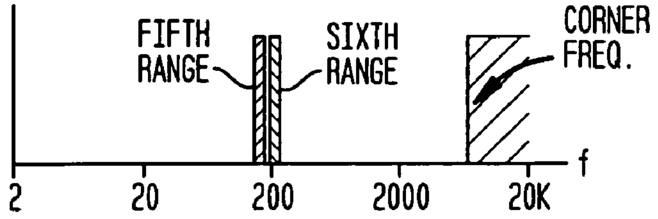
FIG. 2E is a graph (having a logarithmic ordinate scale) illustrating further possible ranges of frequencies that may be contained in one or more further intermediate signals produced by other components used to implement the present invention.

Preferably, the left channel circuit 402 is operable to cancel energy at at least some frequencies from among a fifth range of frequencies from the left channel signal to produce at least a portion of a left channel output signal. It is most preferred that at least some of the frequencies from among the fifth range of frequencies are derived from the right channel signal. Similarly, the right channel circuit 404 is preferably operable to cancel energy at at least some frequencies from among a sixth range of frequencies from the right channel signal to produce at least a portion of a right channel output signal. It is most preferred that at least some of the frequencies from among the sixth range of frequencies are derived from the left channel signal. With reference to FIG. 2E, it has been discovered through experimentation that advantageous results are obtained when one of the fifth and sixth ranges of frequencies extends from about 175 Hz to about 225 Hz and the other of the fifth and sixth ranges of frequencies extends from about 150 Hz to about 200 Hz. Advantageously, removing energy at these selected frequency ranges from respective ones of the left and right channel signals in this manner effectively widens the apparent stereo produced when the left channel output signal and the right channel output signal are converted into audible energy.

Referring to FIG. 7, the left channel circuit 402 preferably includes a high pass filter 408, a band-pass filter 410, an inverting amplifier 412, and a left channel summation circuit 406. The left channel summation circuit 406 preferably includes a first summation circuit 414, an amplifier 416, and a second summation circuit 418. The right channel circuit 404 preferably includes a band-pass filter 420, a high pass filter 422, an inverting amplifier 424, and a right channel summation circuit 407. The right channel summation circuit 407 preferably includes a first summation circuit 426, an amplifier 428, and a second summation circuit 430.

The band-pass filter 410 of the left channel circuit 402 preferably has a center frequency at about a mid-frequency of the fifth or sixth range of frequencies. For the purposes of illustrating the invention, it is assumed that the center frequency of the band-pass filter 410 is at about a mid-frequency of the sixth range of frequencies and is operable to produce an intermediate signal on node 411 containing frequencies of the left channel signal falling substantially within the sixth range of frequencies. The inverting amplifier 412 is preferably operable to produce an inverted left channel signal on node 413 from the intermediate signal on node 411. Similarly, the band-pass filter 420 of the right channel circuit 404 preferably has a center frequency at about a mid-frequency of the fifth range of frequencies to produce an intermediate signal on node 421 containing frequencies of the right channel signal falling substantially within the fifth range of frequencies. The inverting amplifier 424 preferably produces an inverted right channel signal on node 425 from the intermediate signal on node 421.

The left channel summation circuit 406 is preferably operable to sum at least the left channel signal and the inverted right channel signal on node 425 to produce at least a portion of the left channel output signal. Similarly, the right channel summation circuit 407 is preferably operable to sum at least the right channel signal and the inverted left channel signal on node 413 to produce at least a portion of the right channel output signal. Since the inverted right channel signal on node 425 has frequency, amplitude and phase characteristics such that energy of the left channel signal at frequencies from among the fifth range of frequencies are substantially attenuated, energy of the right channel output signal falling within the fifth range of frequencies will be of greater significance when compared to the left channel output signal and, therefore, they will also have a greater affect on a listener to the stereo signal produced by the left and right channel output signals. A parallel effect is achieved by reducing energy of the right channel signal falling within the sixth range of frequencies as determined by the left channel signal to produce the right channel output signal. This advantageously widens the perceived stereo produced by the left and right channel output signals.

A detailed description of the high pass filter 408 and a further description of the left channel summation circuit 406 of the left channel circuit will now be provided. It is noted that the high pass filter 422 and right channel summation circuit 407 of the right channel circuit 404 operate in substantially the same way as the high pass filter 408 and the left channel summation circuit 406 of the left channel circuit 402 except the intermediate signals produced are with respect to the right channel signal and the right channel output signal. For clarity, a detailed description of these right channel components/functions is omitted; indeed, once having considered the description of the corresponding left channel components/functions, one skilled in the art will readily appreciate the details of the right channel operation.

Preferably, the high pass filter 408 of the left channel circuit 402 is operable to receive the left channel signal and produce a left channel boost high pass signal on node 409 containing frequencies from among those at or above a first corner frequency. With reference to FIG. 2E, the first corner frequency is preferably substantially above any of the second, third, fourth, fifth, or sixth frequency ranges. It has been found that a first corner frequency of about 5.3 KHz yields advantageous characteristics in the left channel output signal. Preferably, the left channel summation circuit 406 is further operable to sum the left channel signal, the inverted right channel signal on node 425, and the left channel boost high pass signal on node 409. More specifically, the first summation circuit 414 is preferably operable to sum the left channel high pass signal on node 409 and the inverted right channel signal on node 425 to produce a left channel expansion signal on node 415. The second summation circuit 418 is preferably operable to sum at least the left channel signal and the left channel expansion signal on node 415 to produce at least a portion of the left channel output signal. Preferably, amplifier 416 is operable to variably adjust an amplitude of the left channel expansion signal on node 415 to vary an amount of that signal available to sum with the left channel signal. Advantageously, this permits a user to variably adjust the characteristics of the left channel output signal.

Preferably, the summation circuit 414 is operable to adjustably sum at least the left channel boost high pass signal on node 409 and the inverted right channel signal on node 425 to produce the left channel expansion signal on node 415. The adjustability is preferably user controlled, which advantageously provides for variability in the amount of stereo width expansion produced by the left and right output signals. Further, given that the adjustability balances amounts of stereo width expansion and high frequency boost, the user is advantageously permitted to adjust the overtones, timbre, etc. of the left and right output signals.

Preferably, the high pass filter 408 and the high pass filter 422 are further operable to amplify frequency components of the left channel signal and the right channel signal, respectively, at or above the respective first and second corner frequencies. This results in further advantages in widening the apparent stereo signal produced by the left channel output signal and the right channel output signal. It also "brightens" the resulting audible signal. It is preferred that both the first and second corner frequencies are at about 5.3 KHz.

In accordance with at least one further aspect of the invention, a sub-harmonic generator, such as the sub-harmonic generator 100 of FIG. 1, is utilized in conjunction with the expansion processor 400 of FIG. 7. In particular, the sub-harmonic signal on node 120 (or the filtered sub-harmonic signal on node 134) and the intermediate signal on node 146 are preferably input to both the left channel summation circuit 406 and the right channel summation circuit 407 to produce at least a portion of the left channel output signal and the right channel output signal. Turning again to FIG. 7, the sub-harmonic signal (120 or 134) and the intermediate signals 146 are preferably added to the left channel signal and the left expansion signal on node 415, 417 by way of the second summation circuit 418 to produce at least a portion of the left channel output signal. Similarly, the sub-harmonic signal on node 120 (or 134) and the intermediate signal on node 146 are preferably added to the right channel signal and the right expansion signal on nodes 427, 429 by way of the second summation circuit 430 to produce at least a portion of the right channel output signal.

Figure 8:
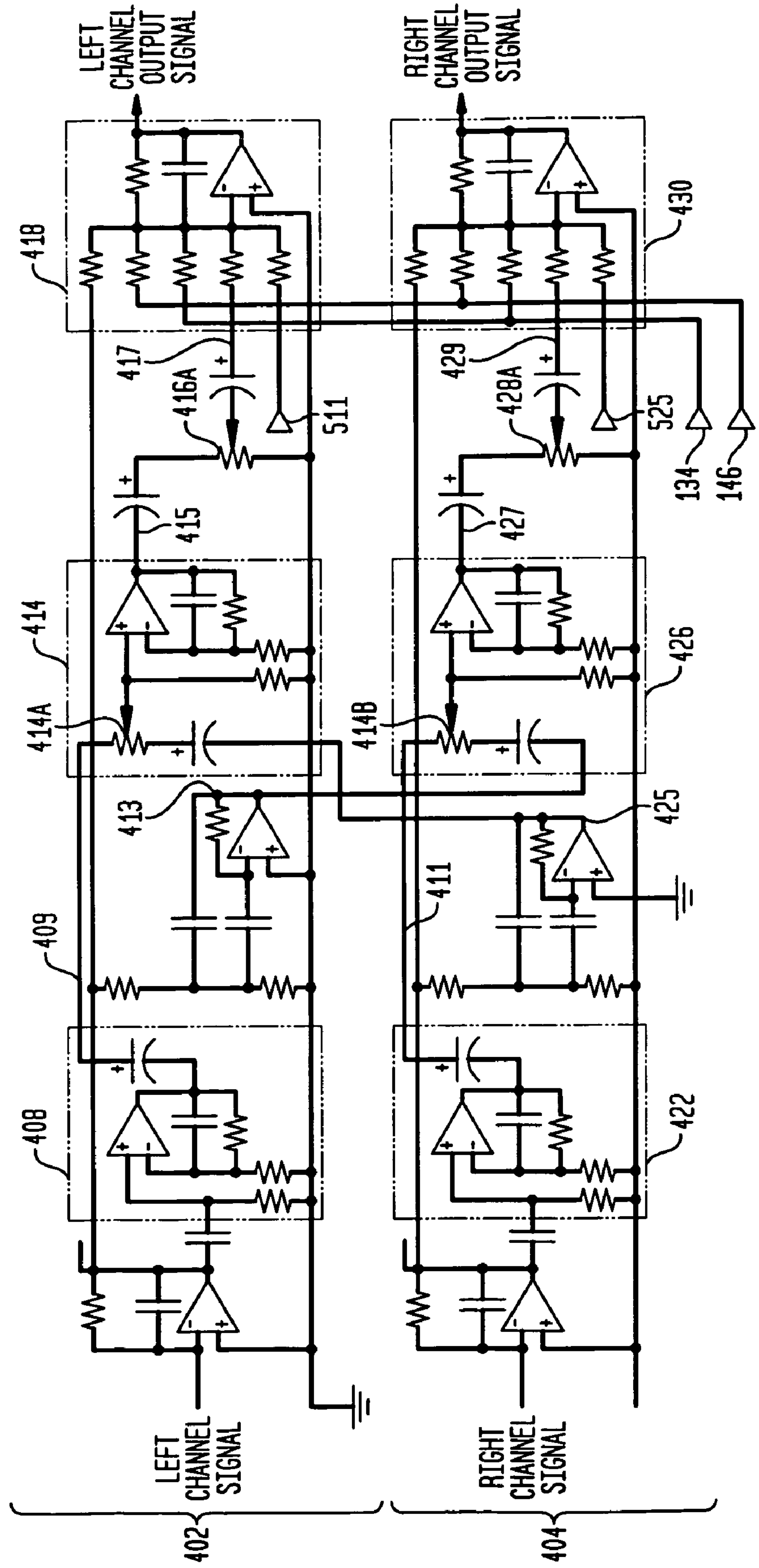
FIG. 8 is a detailed schematic diagram illustrating one or more circuits suitable for implementing one or more actions/functions of the expansion processor of FIG. 7.

Any of the known circuit implementations may be utilized to implement the functions of the left channel circuit 402 and the right channel circuit 404. With reference to FIG. 8, a preferred analog circuit schematic is shown which illustrates one way of implementing the functions of the expansion circuit 400. It is noted that any of the known digital implementations may be alternatively (or additionally) employed including programmable devices, without departing from the scope of the invention.

FIG. 8 shows that the high pass filter 408 and the high pass filter 422 may be implemented utilizing well known active analog circuitry to produce the respective boost high pass signals on nodes 409 and 423. Further, well known active analog circuitry may be utilized as shown to implement the band-pass filter 410 and the band-pass filter 420 to produce the respective inverted left and right channel signals on nodes 413 and 425, respectively.

The adjustable summing functions of the first summing circuit 414 of the left channel summation circuit 406 and the first summing circuit 426 of the right channel summation circuit 407 are preferably implemented utilizing analog operational amplifier technology as shown. In particular, the respective adjustment functions are preferably achieved by way of respective adjustment controls. In this example, the adjustment controls are implemented by way of variable resistors (e.g., potentiometers) 414A and 414B. The potentiometer 414A is operable to adjust respective portions of the left channel boost high pass signal on node 409 and the inverted right channel signal on node 425 that are summed to produce the left channel expansion signal on node 415. Similarly, the potentiometer 414B is preferably operable to vary respective portions of the right channel boost high pass signal on node 411 and the inverted left channel signal on node 413 that are summed to produce the right channel expansion signal on node 427. Preferably, the adjustment controls, e.g. the potentiometer 414A and the potentiometer 414B are ganged such that the variability in the respective left and right channel expansion signals occurs simultaneously.

In this example, the respective amplifiers 416 and 428 have been replaced by passive components that are operable to vary respective magnitudes of the left channel expansion signal on node 415 and the right channel expansion signal on node 427. In particular, respective potentiometers 416A and 428A are employed for implementing this function.

The second summing circuit 418 of the left channel summation circuit 406 and the second summing circuit 430 of the right channel summation circuit 407 are preferably implemented by way of respective inverting summing amplifiers as shown. Each of a plurality of input resistors are employed to couple respective signals to be summed. For example, the second summing circuit 418 employs a respective input resistor for each of the left channel signal, the intermediate signal on node 146, the sub-harmonic signal on node 134, the left channel expansion signal on node 417, and another signal on node 511 (which will be discussed in further detail later in this description). Similar input resistors are employed in the second summing circuit 430 of the right channel summation circuit 407.

Figure 9:
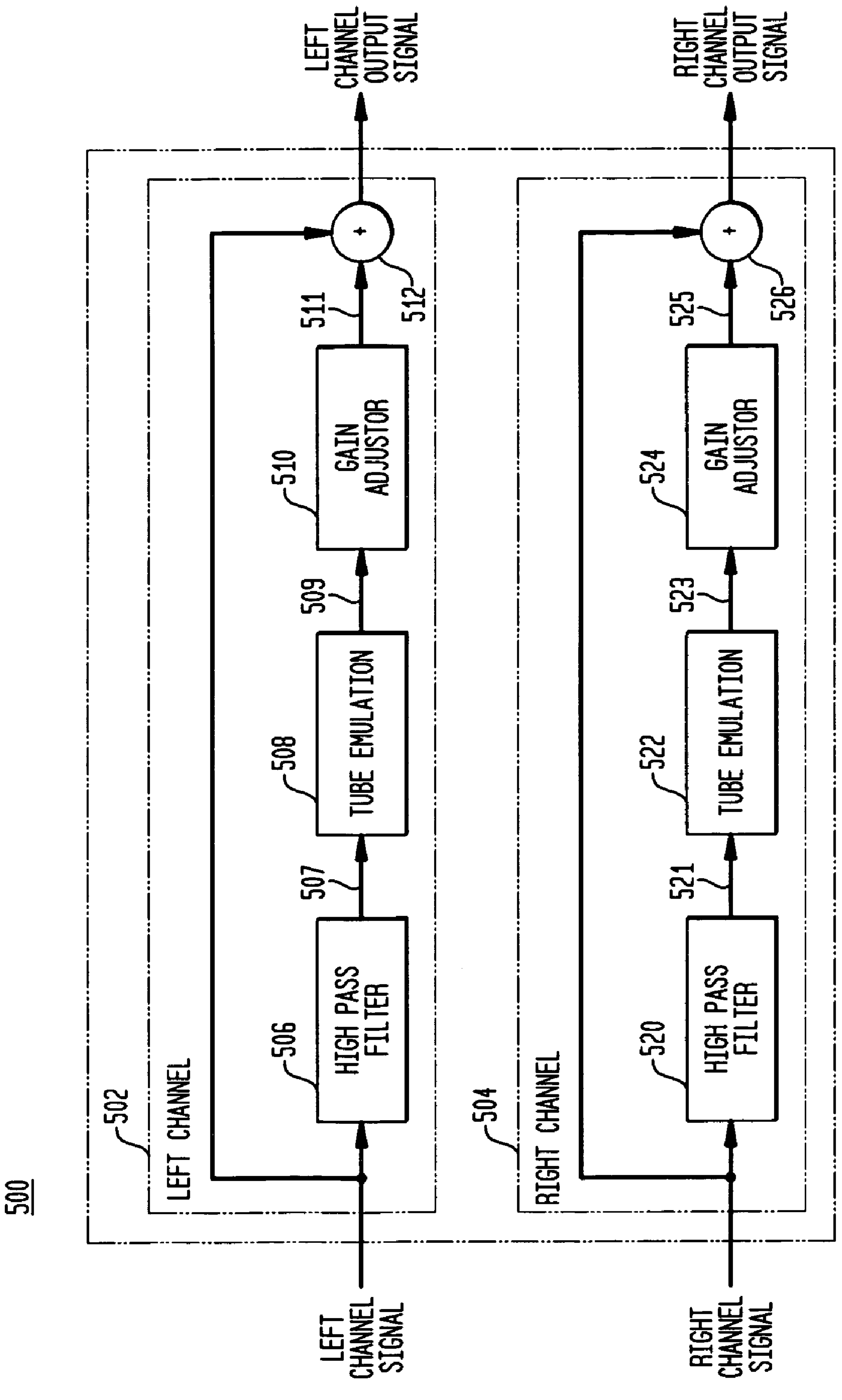
FIG. 9 is a block diagram of a signal processor in accordance with the present invention.

With reference to FIG. 9, and in accordance with at least one further aspect of the present invention, a signal processing system 500 for modifying characteristics of the left channel signal and the right channel signal is contemplated. The signal processing system 500 is illustrated by way of a block diagram partitioned into respective action/functional blocks. As with the block diagram illustrated in FIG. 1, the block diagram of FIG. 9 may represent an apparatus or method, although for the purposes of brevity and discussion, the block diagram will be assumed to represent an apparatus. The signal processing system 500 preferably includes a left channel circuit 502 and a right channel circuit 504 that are operable to receive the respective left channel signal and right channel signal and produce at least portions of respective left and right channel output signals. The left channel circuit 502 preferably includes a high pass filter 506, a tube emulation circuit 508, a gain adjustor 510, and a summer 512. Similarly, the right channel circuit 504 preferably includes a high pass filter 520, a tube emulation circuit 522, a gain adjustor 524 and a summer 526.

The high pass filter 506 is preferably operable to receive the left channel signal and produce a left channel high pass signal on node 507 that contains frequencies from among those at or above a first corner frequency. Preferably the first corner frequency is taken from a range between about 8 KHz and about 11 KHz, where a corner frequency of 9 KHz or 10.7 KHz is preferred. The high pass filter 520 of the right channel circuit 504 is preferably operable to receive the right channel signal and produce a right channel high pass signal on node 521 containing frequencies from among those at or above a second corner frequency. The second corner frequency is preferably different from the first corner frequency of the high pass filter 506. For example, when the first corner frequency of the high pass filter 506 is 9 KHz, then the second corner frequency of the high pass filter 520 is preferably 10.7 KHz. Preferably, the second corner frequency is taken from a range of frequencies between about 8 KHz to about 11 KHz.

As will be discussed in more detail later in this discussion, the signal processing system 500 may be employed in combination with the stereo width expansion processor 400. To that end, the first and second corner frequencies of the high pass filter 506 and the high pass filter 520 are preferably substantially above the corner frequencies of the high pass filter 408 and the high pass filter 422 (FIG. 7) of the stereo with expansion processor 400.

Figure 10:
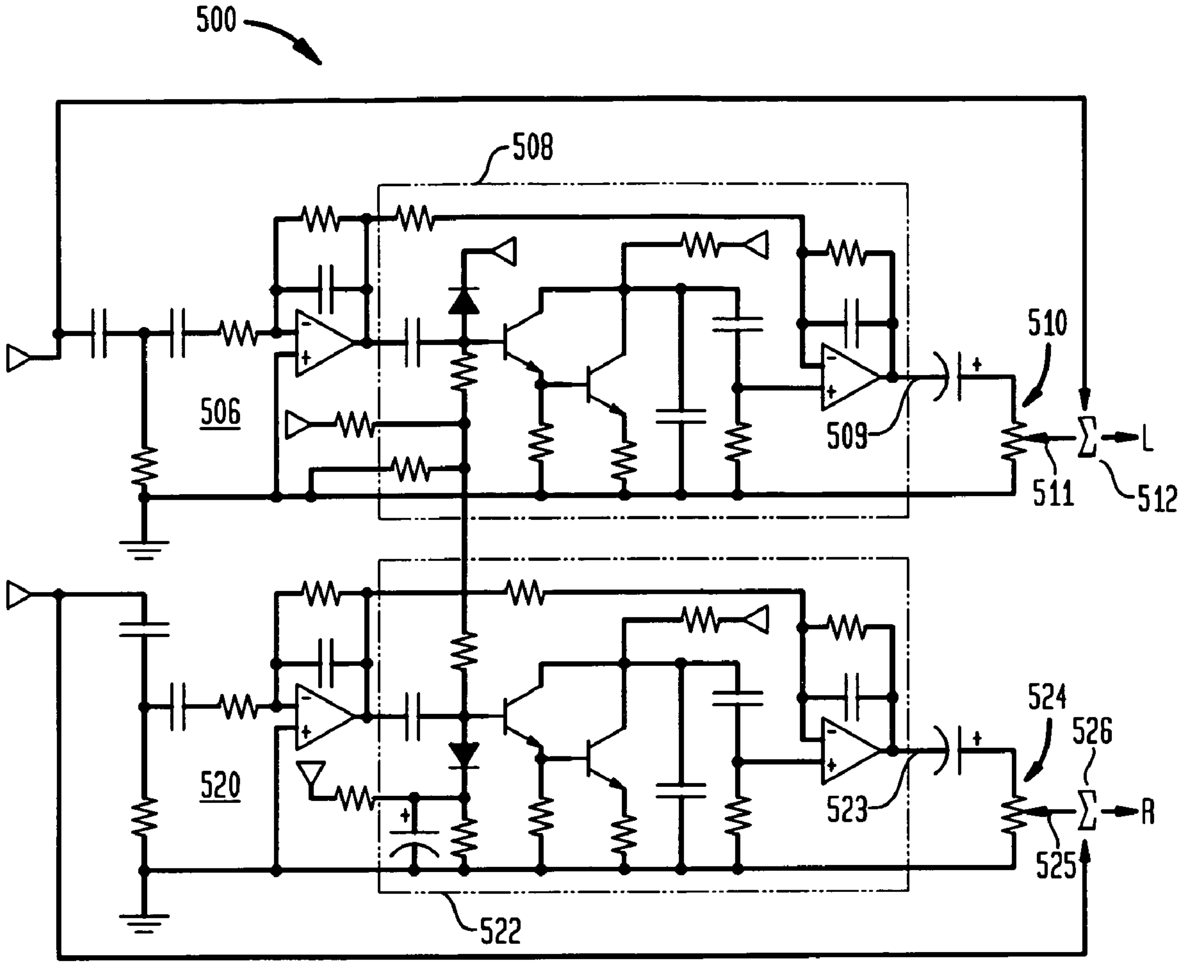
FIG. 10 is a detailed schematic diagram illustrating examples of circuits that may be utilized to implement one or more of the actions/functions of the signal processor of FIG. 9.

Examples of circuits suitable for carrying out the actions/functions of the high pass filters 506, 520, and indeed the entire signal processing system 500, are illustrated in FIG. 10. It is noted that the circuit implementation illustrated in FIG. 10 employs analog circuit techniques, although other implementation techniques may be employed without departing from the scope of the invention. For example, digital circuit techniques may be employed, including the use of programmable devices. The high pass filter 506 and the high pass filter 520 are preferably implemented utilizing active filters employing operational amplifiers and networks of resistors and capacitors.

The tube emulation circuit 508 of the left channel circuit 502 is preferably operable to distort the left channel high pass signal on node 507 to produce a left channel distortion signal on node 509 having at least second harmonic frequency components associated with the left channel high pass signal. Preferably, the tube emulation circuit 508 has a transfer function that emulates the distortion produced by a vacuum tube amplifier.

The tube emulation circuit 522 of the right channel circuit 504 is preferably substantially similar to the tube emulation circuit 508 of the left channel circuit 502. With reference to FIG. 10, the tube emulation circuit 508, 522 are preferably implemented by way of active analog circuitry, each employing a Darlington pair of NPN transistors biased in such a way that, in combination with an active filter, the tube distortion of a vacuum tube amplifier is emulated. It is most preferred that the tube emulation circuit 508, 522 employ Transtube® technology of the Peavey Electronics Corporation, the assignee of the instant invention. Additional details concerning the Transtube® technology may be found, for example, in U.S. Pat. Nos. 5,619,578 and 5,647,004, the entire disclosures of which are hereby incorporated by reference.

Referring to FIG. 9, the gain adjustor 510 is preferably operable to vary a magnitude of the left channel distortion signal on node 509 for input via node 511 to summer 512. Similarly, the gain adjustor 524 of the right channel circuit 504 is preferably operable to vary a magnitude of the right channel distortion signal on node 523 for input via node 525 to summer 526. With reference to FIG. 10, the gain adjustors 510, 524 are preferably implemented by way of a variable resistor, such as a potentiometer. Preferably, the gain adjustors 510, 524 are operable to simultaneously adjust the magnitudes of the left and right channel distortion signals. User control of the gain adjustors 510, 524 is most preferred.

With reference to FIG. 9, the summer 512 is preferably operable to aggregate the left channel signal and left channel distortion signal to produce at least a portion of a left channel output signal. Similarly, the summer 526 is preferably operable to aggregate the right channel signal and right channel distortion signal to produce at least a portion of a right channel output signal. Advantageously, the left and right channel distortion signals introduce an acoustic sheen or brightness into the audio content. Furthermore, the offset between the first and second corner frequencies of the high pass filter 506 and the high pass filter 520, respectively, introduces a stereo width expansion effect into the stereo sphere created by the left and right channel output signals.

As discussed above, the signal processing system 500 may be combined with the stereo width expansion processor 400 of FIG. 7. To that end, the action/functional blocks of the left channel circuit 502 of the signal processing system 500 may be incorporated separate from or within the left channel circuit 402 of the stereo width expansion processor 400. Irrespective of how the incorporation is implemented, the left channel distortion signal on node 511 is preferably input to the second summing circuit 418 of the left channel summation circuit 406. In this way, the left channel signal may be aggregated with one or more of the left channel expansion signal on node 417, the sub-harmonic signal on node 134, the intermediate signal on node 146, and/or the left channel distortion signal on node 511 to produce the left channel output signal.

Similarly, the action/functional blocks of the right channel circuit 504 of the signal processing system 500 may be integrated with the action/functional blocks of the right channel circuit 404. The right channel distortion signal on node 525 is preferably input to the second summing circuit 430 of the right channel summation circuit 407. In this way, the right channel signal may be aggregated with one or more of the right channel expansion signal on node 429, the sub-harmonic signal on node 134, the intermediate signal on node 146, and/or the right channel distortion signal on node 525 to produce the right channel output signal.

The above aspects of the present invention enjoy wide application, particularly in the audio context. For example, stereo systems, home theaters, car stereos, drum equipment, sound systems utilized by disc jockeys, etc. may utilize one or more aspects of the invention to improve audible sound quality and, therefore, increase user satisfaction.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

What is claimed is:

1. A sub-harmonic generator, comprising:

an input band-pass filter operable to receive an input signal containing frequencies from among a first range and to produce a first intermediate signal containing frequencies from among a second range, wherein the band-pass filter includes a low pass filter having a first corner frequency and a high pass filter having a second corner frequency, the first corner frequency being greater than the second corner frequency, and the low pass filter is operable to receive the input signal and to produce a low pass signal, and the high pass filter is operable to receive the low pass signal and to produce the first intermediate signal;

a signal divider circuit operable to receive the first intermediate signal and to produce a second intermediate signal containing signal components at frequencies from among a third range, the third range of frequencies being about one octave below the second range of frequencies;

an envelope detector operable to produce an envelope signal corresponding to an instantaneous amplitude of the first intermediate signal;

a gain control circuit operable to at least variably adjust a gain of the envelope signal; and a voltage controlled amplifier operable to amplify the second intermediate signal by an amount proportional to the envelope signal to produce a sub-harmonic signal.

2. The sub-harmonic generator of claim 1, wherein the gain control circuit is operable to variably increase or decrease rates of sloping portions of the envelope signal.

3. The sub-harmonic generator of claim 2, wherein the gain control circuit includes a user adjustable control to increase or decrease the rates of the sloping portions of the envelope signal.

4. The sub-harmonic generator of claim 2, wherein the slope adjustment circuit includes an adjustable gain amplifier operable to increase or decrease the rates of the sloping portions of the envelope signal by a factor of about 1.7 to about 0.7.

5. The sub-harmonic generator of claim 2, wherein the slope adjustment circuit includes a limiter circuit operable to limit an amplitude of the envelope signal.

6. The sub-harmonic generator of claim 1, further comprising an offset circuit operable to increase or decrease an amplitude of the envelope signal by an adjustable offset value as the gain control circuit variably increases or decreases rates of sloping portions of the envelope signal.

7. The sub-harmonic generator of claim 6, further comprising a user adjustable control operable to simultaneously (i) vary a gain of an adjustable gain amplifier that is operable to increase or decrease the rates of the sloping portions of the envelope signal; and (ii) vary the amplitude of the envelope signal by adding the offset value.

8. The sub-harmonic generator of claim 1, wherein the envelope detector includes an RMS detector operable to produce the envelope signal such that it corresponds to the instantaneous amplitude of the first intermediate signal.

9. The sub-harmonic generator of claim 1, further comprising a summing circuit operable to receive a stereo signal including a left channel signal and a right channel signal, and to aggregate the left and right channel signals to produce the input signal.

10. The sub-harmonic generator of claim 1, wherein the input filter is operable such that the second range is within about 40-110 Hz.

11. The sub-harmonic generator of claim 1, wherein the signal divider circuit is operable such that the third range of frequencies is within about 20 Hz to about 55 Hz.

12. The sub-harmonic generator of claim 1, further comprising:

a summing circuit operable to receive a stereo signal including a left channel signal and a right channel signal, and to aggregate the left and right channel signals to produce the input signal;

a left channel summation circuit operable to sum the left channel signal and the sub-harmonic signal to produce at least a portion of a left channel output signal; and a right channel summation circuit operable to sum the right channel signal and the sub-harmonic signal to produce at least a portion of a right channel output signal.

13. The sub-harmonic generator of claim 1, wherein at least one of the input filter, the signal divider circuit, the envelope detector, the gain control circuit, and the voltage controlled amplifier is implemented using one or more programmable devices.

14. A method, comprising:

receiving an input signal containing frequencies from among a first range and producing a first intermediate signal containing frequencies from among a second range;

producing a second intermediate signal from the first intermediate signal, the second intermediate signal being a square wave signal produced from the first intermediate signal by comparing respective amplitudes of the first intermediate signal and a reference potential and transitioning a zero crossing signal each time the amplitude of the reference potential substantially equals the first intermediate signal, such that the second intermediate signal contains signal components at frequencies from among a third range, the third range of frequencies being about one octave below the second range of frequencies;

producing an envelope signal corresponding to an instantaneous amplitude of the first intermediate signal;

variably adjusting a gain of the envelope signal; and amplifying the second intermediate signal by an amount proportional to the envelope signal to produce a sub-harmonic signal.

15. The method of claim 14, wherein the step of variably adjusting the gain of the envelope signal includes variably increasing or decreasing rates of sloping portions of the envelope signal.

16. The method of claim 15, wherein the step of variably adjusting the gain of the envelope includes providing a user adjustable control to increase or decrease the rates of the sloping portions of the envelope signal.

17. The method of claim 15, wherein the step of variably adjusting the gain of the envelope signal includes increasing or decreasing the rates of the sloping portions of the envelope signal by a factor of about 1.7 to about 0.7.

18. The method of claim 15, further comprising limiting an amplitude of the envelope signal.

19. The method of claim 14, further comprising increasing or decreasing an amplitude of the envelope signal by an adjustable offset value as rates of sloping portions of the envelope signal are variably increased or decreased.

20. The method of claim 19, wherein the step of increasing or decreasing the amplitude of the envelope signal includes simultaneously (i) increasing or decreasing the rates of the sloping portions of the envelope signal; and (ii) varying the amplitude of the envelope signal by adding the offset value.

21. The method of claim 14, wherein the step of producing the envelope signal includes determining an RMS value of the first intermediate signal.

22. The method of claim 14, further comprising receiving a stereo signal including a left channel signal and a right channel signal, and aggregating the left and right channel signals to produce the input signal.

23. The method of claim 14, wherein the second range is within about 40-110 Hz.

24. The method of claim 14, wherein the third range of frequencies is within about 20 Hz to about 55 Hz.

25. The method of claim 14, further comprising:

receiving a stereo signal including a left channel signal and a right channel signal, and aggregating the left and right channel signals to produce the input signal;

summing the left channel signal and the sub-harmonic signal to produce at least a portion of a left channel output signal; and summing the right channel signal and the sub-harmonic signal to produce at least a portion of a right channel output signal.

26. A sub-harmonic generator, comprising:

a sub-harmonic signal circuit operable to (i) receive an input signal containing frequencies from among a first range, (ii) band-pass filter the input signal to produce a first intermediate signal containing frequencies from among a second range, wherein the band-pass filter includes a low pass filter having a first corner frequency and a high pass filter having a second corner frequency, the first corner frequency being greater than the second corner frequency, and the low pass filter is operable to receive the input signal and to produce a low pass signal, and the high pass filter is operable to receive the low pass signal and to produce the first intermediate signal, (iii) produce an envelope signal corresponding to an instantaneous amplitude of the first intermediate signal, (iv) produce a sub-harmonic signal from the first intermediate signal containing frequencies from among a third range, the third range of frequencies being about one octave below the second range of frequencies, and (v) voltage control amplify the sub-harmonic signal by an amount proportional to the envelope signal; and an adjustment circuit operable to at least one of: (i) alter a frequency content of the sub-harmonic signal using a band of frequencies of the input signal, and (ii) variably adjust a gain of the envelope signal to alter an amplitude envelope of the sub-harmonic signal in order to produce at least a portion of an output signal.

27. A method, comprising:

receiving an input signal containing frequencies from among a first range;

band-pass filtering the input signal to produce a first intermediate signal containing frequencies from among a second range, wherein the band-pass filter includes a low pass filter having a first corner frequency and a high pass filter having a second corner frequency, the first corner frequency being greater than the second corner frequency, and the low pass filter is operable to receive the input signal and to produce a low pass signal, and the high pass filter is operable to receive the low pass signal and to produce the first intermediate signal;

producing an envelope signal corresponding to an instantaneous amplitude of the first intermediate signal;

producing a sub-harmonic signal from the first intermediate signal containing frequencies from among a third range, the third range of frequencies being about one octave below the second range of frequencies;

voltage control amplifying the sub-harmonic signal by an amount proportional to the envelope signal; and at least one of: (i) altering a frequency content of the sub-harmonic signal using a band of frequencies of the input signal, and (ii) variably adjusting a gain of the envelope signal to alter an amplitude envelope of the sub-harmonic signal in order to produce at least a portion of an output signal.

* * * * *